US009980028B2

(12) United States Patent
McNeill et al.

(10) Patent No.: US 9,980,028 B2
(45) Date of Patent: May 22, 2018

(54) SOUND EXPOSURE LIMITER

(71) Applicant: Plantronics, Inc., Santa Cruz, CA (US)

(72) Inventors: Iain McNeill, Aptos, CA (US); Kwangsee Allen Woo, Scotts Valley, CA (US); John S Graham, Scotts Valley, CA (US)

(73) Assignee: Plantronics, Inc., Santa Cruz, CA (US)

( * ) Notice: Subject to any disclaimer, the term of this patent is extended or adjusted under 35 U.S.C. 154(b) by 0 days. days.

(21) Appl. No.: 15/189,491

(22) Filed: Jun. 22, 2016

(65) Prior Publication Data

US 2017/0374444 A1 Dec. 28, 2017

(51) Int. Cl.

| | |
|---|---|
| ***H03G 3/00*** | (2006.01) |
| ***H04R 1/10*** | (2006.01) |
| ***H04R 29/00*** | (2006.01) |

(52) U.S. Cl.

CPC ............. *H04R 1/10* (2013.01); *H04R 29/001* (2013.01); *H04R 2420/09* (2013.01); *H04R 2430/01* (2013.01); *H04R 2460/01* (2013.01)

(58) Field of Classification Search

CPC .... H04R 1/10; H04R 29/001; H04R 2420/09; H04R 2430/01; H04R 2460/01

USPC ........ 381/56–59, 72, 74, 94.8, 98, 102, 104, 381/107, 309, 320; 330/250, 257; 702/191

See application file for complete search history.

(56) References Cited

U.S. PATENT DOCUMENTS

| | | | | |
|---|---|---|---|---|
| 6,442,279 | B1 * | 8/2002 | Preves | H04R 25/502 381/106 |
| 6,456,199 | B1 * | 9/2002 | Michael | A61F 11/12 340/540 |
| 6,507,650 | B1 * | 1/2003 | Moquin | G01H 3/14 379/387.01 |
| 6,826,515 | B2 | 11/2004 | Bernardi et al. | |
| 7,013,011 | B1 | 3/2006 | Weeks et al. | |
| 7,200,238 | B1 | 4/2007 | Shyu et al. | |
| 7,913,565 | B2 | 3/2011 | Killion et al. | |
| 8,369,535 | B1 | 2/2013 | Shyu et al. | |
| 8,391,503 | B2 | 3/2013 | Bayley et al. | |

(Continued)

OTHER PUBLICATIONS

International Search Report and Written Opinion for international application No. PCT/US2017/036750, dated Sep. 12, 2017 (10 pages).

(Continued)

*Primary Examiner* — Vivian Chin

*Assistant Examiner* — Friedrich W Fahnert

(74) *Attorney, Agent, or Firm* — Chuang Intellectual Property Law

(57) ABSTRACT

Methods and apparatuses for user sound exposure limiting are disclosed. In one example, an accumulated sound dose exposure from a headset speaker is determined for a plurality of sequentially monitored time intervals during a current listening session, wherein the current listening session comprises a total session time. It is determined whether a predicted sound dose exposure for the total session time exceeds or falls below a permitted sound dose exposure limit, the predicted sound dose exposure determined from the accumulated sound dose exposure. A threshold intervention level at which a time-weighted-average limiter at a headset applies attenuation to an audio signal output at a headset speaker is adjusted.

25 Claims, 13 Drawing Sheets

(56) References Cited

U.S. PATENT DOCUMENTS

| | | | | |
|---|---|---|---|---|
| 2006/0147049 | A1 | 7/2006 | Bayley et al. | |
| 2006/0182287 | A1* | 8/2006 | Schulein | H03G 3/32 381/74 |
| 2007/0136050 | A1 | 6/2007 | Tourwe | |
| 2008/0240450 | A1 | 10/2008 | Bayley et al. | |
| 2009/0245537 | A1* | 10/2009 | Morin | H03G 3/3005 381/107 |
| 2009/0315708 | A1 | 12/2009 | Walley et al. | |
| 2010/0046767 | A1* | 2/2010 | Bayley | G01H 3/14 381/59 |
| 2010/0150378 | A1 | 6/2010 | Lee et al. | |
| 2012/0057726 | A1 | 3/2012 | Van Wijngaarden | |

OTHER PUBLICATIONS

Applicant Informal Comments on Written Opinion in international application No. PCT/YUS2017/036750, dated Nov. 9, 2017 (4 pages).

* cited by examiner

| Clip level dB above signal RMS level | Resulting RMS level dB drop due to clipping | % reduction in exposure | distortion perceptible? |
|---|---|---|---|
| 20 | 0 | 0.0 | N |
| 15 | 0.1 | 0.0 | N |
| 10 | 0.6 | 6.2 | ~ |
| 5 | 1.8 | 18.5 | Y |
| 0 | 3.6 | 33.8 | Y |
| -5 | 5.7 | 50.8 | Y |
| -10 | 8 | 63.1 | Y |
| -15 | 10.4 | 73.8 | Y |
| -20 | 12.8 | 81.5 | Y |

FIG. 12

| | mild | medium | aggressive |
|---|---|---|---|
| Expansion Region | | | |
| gain ratio | 1 : 2 | 1 : 3 | 1 : 4 |
| attack time (ms) | 50 | 40 | 30 |
| release time (ms) | 300 | 250 | 200 |
| upper threshold (dBFS) | -60 | -55 | -50 |
| | | | |
| Linear Region | | | |
| gain ratio | 1 : 1.5 | 1 : 1 | 1.5 : 1 |
| attack time | 75 | 50 | 25 |
| release time | 150 | 120 | 75 |
| upper threshold | -20 | -25 | -30 |
| | | | |
| Compression Region | | | |
| gain ratio | 4 : 1 | 6 : 1 | 8 : 1 |
| attack time | 50 | 25 | 5 |
| release time | 100 | 75 | 50 |

FIG. 13

SOUND EXPOSURE LIMITER

BACKGROUND OF THE INVENTION

In a work environment, the accumulated amount of noise, or dose in terms of an average noise level, and the maximum level of noise to which an individual has been exposed during a workday are important to occupational safety and to the health of the individual. Industry and governmental agencies in countries throughout the world, such as the Occupational Safety and Health Administration (OSHA) in the United States, require accurate sound data measurements.

Examples of such sound data measurements include impulse noise, continuous noise, and an eight-hour time-weighted average ("TWA") that is also referred to as "daily personal noise exposure". Impulse noise relates to noise of very short duration. Continuous noise relates to noise that is longer in duration than impact noise, extending longer than 500 milliseconds. Eight-hour TWA relates to the average of all levels of impulse and continuous noise to which an employee is exposed during an eight-hour workday. The OSHA maximum level for impulse noise is 140 dBSPL measured with a fast peak-hold sound level meter ("dBSPL" stands for sound pressure level, or a magnitude of pressure disturbance in air, measured in decibels, a logarithmic scale). The maximum level for continuous noise is 115 dB(A) (read on the slow average with A-weighting). OSHA regulations limit an eight-hour TWA to 90 dB(A). If employees are exposed to eight-hour TWAs between 85 and 90 dB(A), OSHA requires employers to initiate a hearing conservation program which includes annual hearing tests.

Sound exposure (which includes both undesirable noise and personal entertainment or other desired sound) requirements in many countries are becoming more and more stringent and in particular, headsets used for personal entertainment (music, gaming and other multimedia) are being required to limit the daily sound exposure to a specific dB level. It is expected that these dB limits will be reduced in future legislation. It has been found that typical headset or headphone users tend to listen to lower level at the beginning, after a period of time, they like to increase the loudness gradually to maintain the excitement and energy level of the multimedia program they are enjoying.

Current sound exposure limiting solutions in headset measure the sound pressure level being delivered over a short period of time (e.g. 10 mins) and then assume that the level will be maintained for the entire listening session (2, 4, 8 hour period) and limit the loudness accordingly. This approach is simple to implement but fails to account for the fact that a user may have been listening below the limit for a period of time prior to and/or after turning up the volume. This means that the user can never listen above the average sound pressure limit even though it would be safe to do so as their daily exposure dose is well below the regulated limit. Many users find this simple limiting frustrating and a detriment to their listening experience. As a result, improved methods and apparatuses for limiting sound exposure are needed.

BRIEF DESCRIPTION OF THE DRAWINGS

The present invention will be readily understood by the following detailed description in conjunction with the accompanying drawings, wherein like reference numerals designate like structural elements.

FIG. 12 illustrates adjustment of a soft clip level when an accumulated dose passes an intervention threshold level in one example.

FIG. 13 illustrates sample multiband compandor parameter settings in one example.

DESCRIPTION OF SPECIFIC EMBODIMENTS

Methods and apparatuses for sound exposure limiting are disclosed. The following description is presented to enable any person skilled in the art to make and use the invention. Descriptions of specific embodiments and applications are provided only as examples and various modifications will be readily apparent to those skilled in the art. The general principles defined herein may be applied to other embodiments and applications without departing from the spirit and scope of the invention. Thus, the present invention is to be accorded the widest scope encompassing numerous alternatives, modifications and equivalents consistent with the principles and features disclosed herein.

Block diagrams of example systems are illustrated and described for purposes of explanation. The functionality that is described as being performed by a single system component may be performed by multiple components. Similarly, a single component may be configured to perform functionality that is described as being performed by multiple components. For purpose of clarity, details relating to technical material that is known in the technical fields related to the invention have not been described in detail so as not to unnecessarily obscure the present invention. It is to be understood that various example of the invention, although different, are not necessarily mutually exclusive. Thus, a particular feature, characteristic, or structure described in one example embodiment may be included within other embodiments unless otherwise noted.

The inventors have recognized that current sound limiting methods and apparatuses employ an overly conservative limiting strategy. The current use of a 10 minute exponential average for evaluating TWA exposure was justified until recently. It was efficient requiring only a few cycles to compute, did not require Non-Volatile storage (NVRAM) to be regularly updated at a time when write cycles for NVRAM were limited and it resolved issues related to agents circumventing protection devices by power cycling or multiple shift situations where agents would share headsets. By ensuring that the acoustic energy delivered in any 10 minute window never exceeds the TWA limit in force (e.g., 80, 85 or 90 dBA), it is guaranteed that the limit will not be exceeded during the shift. However, as will be shown, this leads to an overly conservative limiting strategy.

Figure 1:
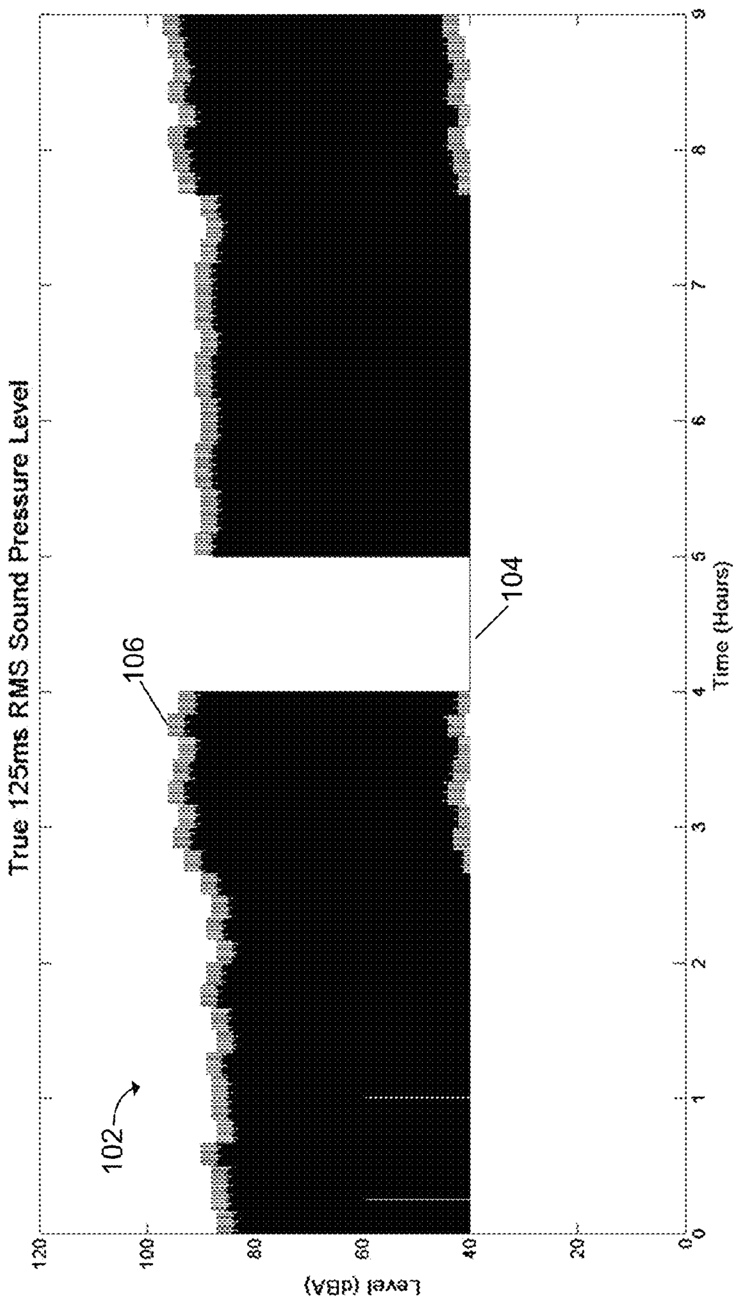
FIG. 1 illustrates a true 125 ms Root Mean Square (RMS) sound pressure level delivered by a headset in one example.
Figure 2:
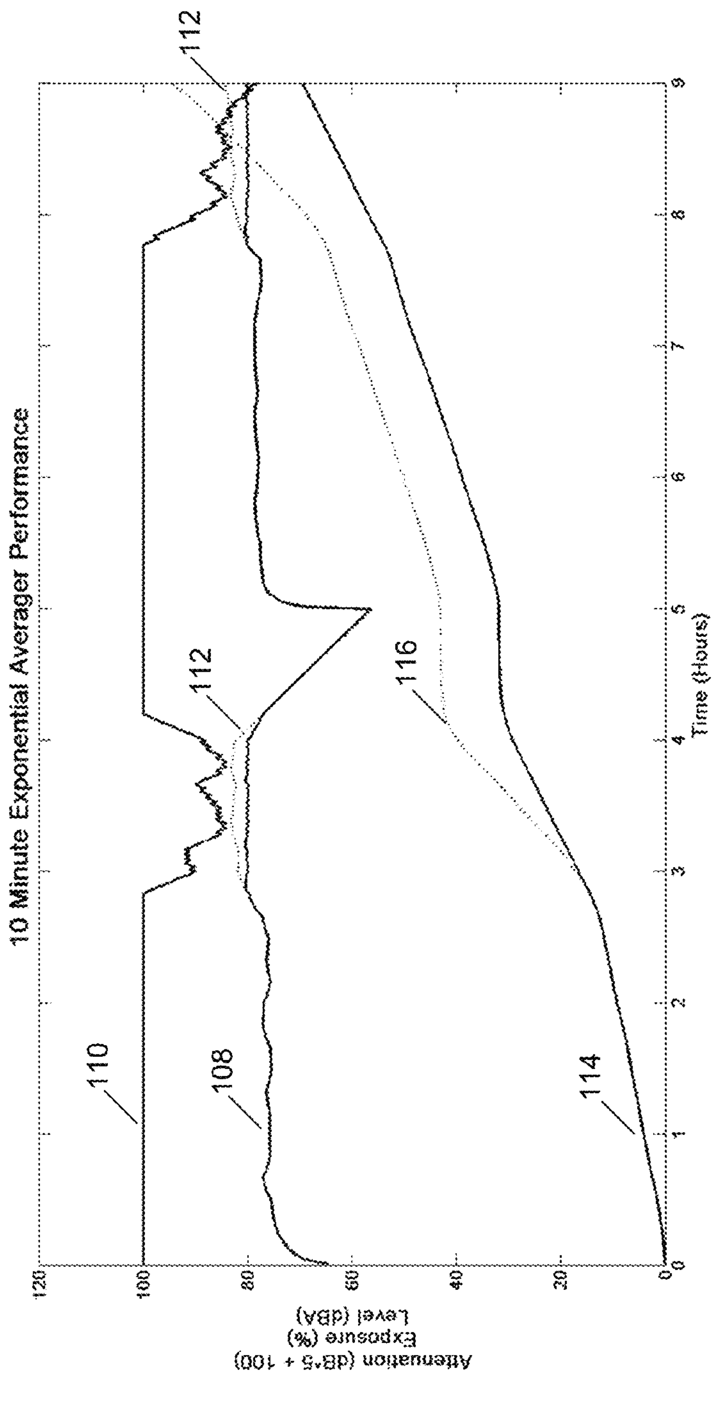
FIG. 2 illustrates operation of a current time-weighted-average limiter on the signal shown in FIG. 1 in one example.

A TWA limiter using the 10 minute exponential average strategy has a number of shortcomings. In FIG. 1 and FIG. 2, a call center shift is simulated to highlight these issues. FIG. 1 illustrates a true 125 ms Root Mean Square (RMS) sound pressure level delivered by a headset in one example. FIG. 2 illustrates operation of a current time-weighted-average limiter on the signal shown in FIG. 1, i.e., a simulated TWA performance of a 10 minute exponential average limiter.

Referring to FIG. 1, a true 125 ms Root Mean Square (RMS) sound pressure level 102 delivered by the headset is shown. Periods of silence 104 between utterances are set to 40 dBA representing a quiet ambient environment while speech peaks 106 range between 85 and 95 dBA.

Referring to FIG. 2, line 108 represents the output of the 10 minute exponential average level meter and is compared to the TWA limit of 80 dBA to determine when limiting is required. The line 110, starting at 100 on the vertical axis, represents the attenuation applied by the TWA limiter and is scaled such that 100=0 dB and 80=−4 dB of limiting. When the limiter applies attenuation, the dashed line 112 shows what the 10 minute exponential average would have been if limiting were not applied. The line 114 starting at 0 hours on the horizontal axis represents the accumulated exposure calculated according to the dosimetry specifications of TWA safety standards using the 10 minute exponential average level with the dashed line 116 showing what exposure would have been without limiting while the solid line shows exposure after limiting.

The efficacy of the limiting strategy has been recognized by the inventors. The accumulated exposure delivered by the limiting headset is brought down to around 70% of the allowable dose. However, in the fourth hour of the shift, a TWA limiting event occurred when the accumulated exposure was only 17%. This event would have been a frustrating situation for the agent, possibly due to increased background noise from a busy period, the agent would turn up the volume to compensate for the limiting attenuation only to have the limiter apply more attenuation. A second limiting event occurs towards the end of the shift and this is more plausible, but the event is not due to the accumulated dose, rather the 10 minute exponential average reaching the TWA limit again and, at the end of the shift, the accumulated dose is only 70%. Worse, for this particular scenario, limiting was not needed at any point during the shift as the unlimited exposure only reached 95%.

With the limiting event occurring just before lunch break, the agent would probably have left the volume control in the elevated position. On returning from lunch, the TWA limiting has released due to the period of inactivity, the agents hearing will have recovered and the background noise may have reduced. The first call received by the agent may be quite startling. Furthermore, the exposure continues to accumulate during the period of inactivity at lunch break due to the slow decay time of the 10 minute exponential average which is clearly incorrect.

As a result of recognizing the overly conservative limiting strategy in current methods, the inventors have devised new methods and apparatuses for sound exposure limiting. In one example, methods and apparatuses described herein use a different approach to the TWA limiting problem and acknowledges the fact that typical users will start to listen relatively quietly and then progressively turn the loudness up during their listening session. The new technique, implemented as an algorithm on a Digital Signal Processor (DSP) on a USB or wireless headset keeps track of the TWA dose for a particular session such that the time spent listening at a level below the threshold provides a "credit" that can then be used to listen for an equivalent period above the threshold. Alternatively, a short period of above-threshold listening could be permitted with the headset/headphone then only later limiting below the threshold to ensure the daily exposure dose is not exceeded.

The sound dose or exposure units are summed and stored in non-volatile memory on a 10 minute basis (current TWA algorithms use a 10 minute integrating window to evaluate TWA exposure) so as not to place a burden on the processor or impact the lifetime of the non-volatile memory. Keeping the accumulated dose in non-volatile memory addresses the concern that a user might re-initialize their headset to defeat the TWA limiter and effectively start again afresh. The cumulated exposure dose refreshed/restarts after a defined period (for instance 10 hours) of "no-activity". A "no-activity" means no signal fed to the speakers of the headset/headphone. By accumulating the actual sound exposure rather than a prediction based on a short term estimate, a more intelligent limiting scheme can be provided. Advantageously, user experience and enjoyment of their headset is enhanced while still providing the benefit and safety of hearing protection.

In one enhancement, cloud based data storage is utilized. By storing the dose or exposure units in a database in the cloud, more accurate and intelligent limiting strategies that take better account of varying listening patterns could be applied. Listening patterns over multiple days could be analyzed and a unique limiting profile designed to address the specific needs of a user. In a Contact Center, by using a log-on procedure, the accumulated dose could be assigned to a particular person allowing installations where headsets are shared to provide independent limiting for different agents on sequential shifts. Reports of daily exposure per agent per week could be provided to prove compliance. Again, the cumulated exposure dose refreshed/restarts after a defined period (x hours) of "no-activity".

In one example, a method for limiting a headset user sound exposure includes determining a current sound subdose for a current pre-determined time interval a headset user is exposed to resulting from an audio signal output at the headset speaker. The method includes determining a predicted sound dose exposure for a total time period from the current sound subdose, and determining whether the predicted sound dose exposure for the total time period exceeds a permitted total time period sound dose limit or falls below the permitted total time period sound dose limit. The method includes determining an accumulated sound dose exposure, the accumulated sound dose exposure including the sum of the current sound subdose with all prior determined sound subdoses from prior pre-determined time intervals. The method further includes adjusting an intervention threshold responsive to the accumulated sound dose exposure and the predicted sound dose exposure for the total time period. The method includes attenuating an output level of the audio signal from the headset speaker responsive to determining the intervention threshold is exceeded by the audio signal.

In one example, a method for limiting a headset user sound exposure includes determining an accumulated sound dose exposure from a headset speaker for a plurality of sequentially monitored time intervals during a current listening session, wherein the current listening session comprises a total session time. The method includes determining whether a predicted sound dose exposure for the total session time exceeds or falls below a permitted sound dose exposure limit, the predicted sound dose exposure determined from the accumulated sound dose exposure. The method further includes adjusting a threshold intervention level at which a time-weighted-average limiter at a headset applies attenuation to an audio signal output at a headset speaker, the threshold intervention level adjusted responsive to whether the predicted sound dose exposure for the total session time exceeds or falls below the permitted sound dose exposure limit.

In one example, a head-worn device includes a communications interface, a speaker for outputting an audio signal into a user ear, an amplifier, a time-weighted-average limiter, and a processor. The head-worn device further includes one or more memories storing one or more application programs including instructions executable by the processor to cause the head-worn device to perform operations including determining an accumulated sound dose exposure from the audio signal output at the speaker, and determining whether a predicted sound dose exposure for a total session time exceeds or falls below a permitted sound dose exposure limit, the predicted sound dose exposure determined from the accumulated sound dose exposure. The operations include adjusting a threshold intervention level at which the time-weighted-average limiter applies attenuation to the audio signal output at the headset speaker, the threshold intervention level adjusted responsive to whether the predicted sound dose exposure for the total session time exceeds or falls below the permitted sound dose exposure limit.

Figure 3:
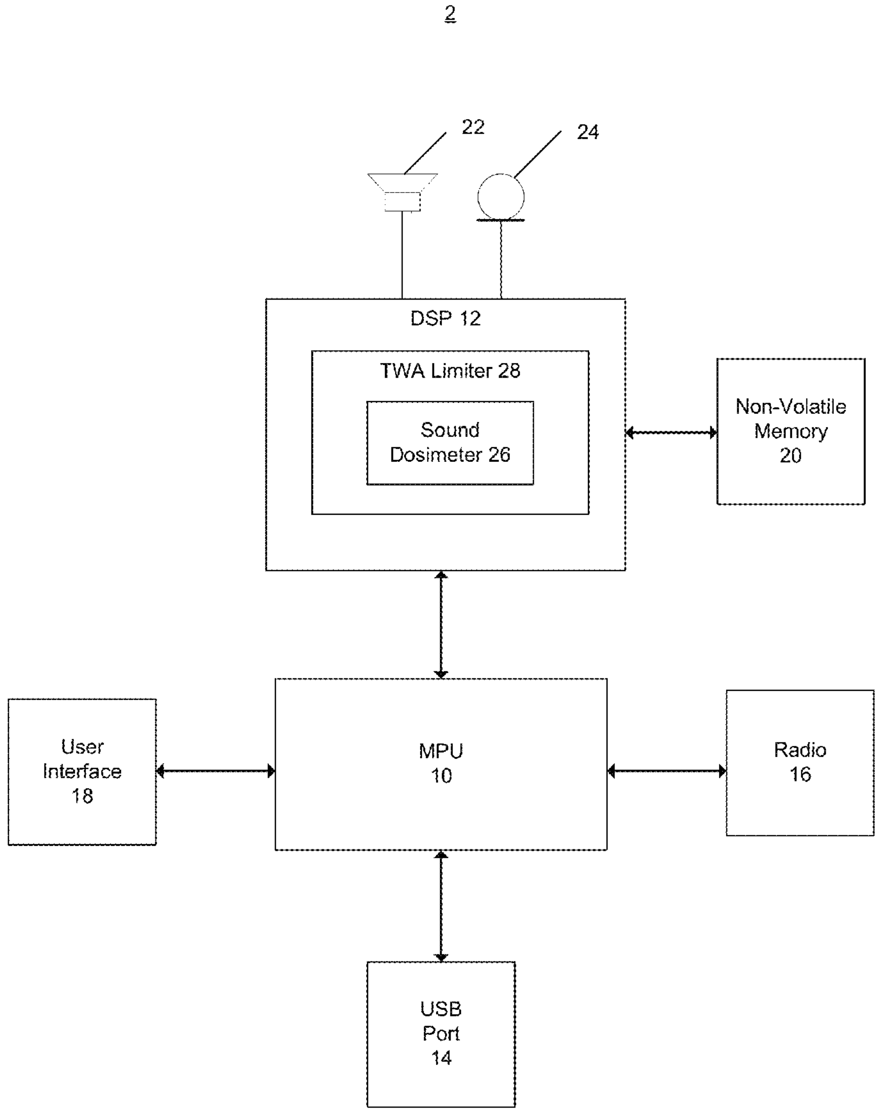
FIG. 3 illustrates a simplified block diagram of one example configuration of a headset having an improved time-weighted average limiter.

FIG. 3 illustrates a simplified block diagram of one example configuration of a headset 2 having an improved time-weighted average limiter. Headset 2 includes a time-weighted average limiter 28 for modifying an amplifier gain of an output audio signal based on a sound dosimeter 26 output measuring (also referred to as calculating or determining) sound dose. Although shown as integrated with TWA limiter 28, sound dosimeter 26 may be a separate module in communication with TWA limiter 28. In one example, headset 2 is a wireless headset including a communications interface (e.g., radio transceiver 16), microprocessor unit (MPU) 10, digital signal processor (DSP) 12, user interface 18, non-volatile memory 20, a receiver in the form of speaker 22 for outputting an audio signal into a user ear, and a microphone 24. For example, radio transceiver 16 may be a Bluetooth, DECT, or WiFi transceiver. Microprocessor unit 10 implements some or all of the Bluetooth/DECT/Wifi protocol stack, performs system control, and transfers audio data between the radio transceiver 16 and digital signal processor 12.

In a further example, headset 2 does not utilize a separate DSP 12, and functions described herein performed by DSP 12 are performed by MPU 10. Headset 2 includes a USB interface port 14 that can be used for data transfer, headset configuration, software updates and headset battery charging. The DSP 12 performs audio signal processing on the audio streams flowing between the headset's speaker 22 and microphone 24 and the radio transceiver 16. The DSP 12 also implements the sound exposure dosimeter calculations described herein utilizing sound exposure dosimeter 26 and implements time-weighted-average (TWA) limiting utilizing TWA limiter 28.

Non-volatile memory 20 stores a filter modeling a frequency response associated with the speaker 22 and recorded individual and accumulated sound subdose measurements. In one example, the DSP 12 calculates a sound dose responsive to establishment and termination of an active wireless communications link by the wireless communications transceiver.

In one example, the radio transceiver 16 is a Bluetooth radio transceiver and the active wireless communications link is a Bluetooth audio SCO channel. The headset 2 includes TWA limiter 28 modifying a gain of the audio signal responsive to a threshold intervention level being exceeded. TWA limiter 28 adjusts this threshold intervention level responsive to whether the predicted sound dose exposure exceeds or falls below a permitted sound dose exposure limit. TWA limiter 28 calculates a gain adjustment for the input audio signal such that the cumulative sound to which the user is exposed through the headset remains in compliance with OSHA requirements or other user-selected exposure limits. The headset 2 may also provide a user interface warning option such as an earcon or LED light in addition to modifying the gain when the predicted sound dose exposure will exceed a permitted level.

The DSP 12 implements all required audio signal processing in software. For example, DSP 12 calculates sound dose and sound exposure using sound exposure dosimeter 26 and controls gain utilizing TWA limiter 28 as described herein in reference to FIGS. 5-6 and 9-10. Sending-channel processing is applied to the headset-wearer's speech that is captured by the microphone 24. The sending-channel processing typically includes an acoustic echo canceller to prevent the far-end talker's speech from feeding back from the speaker 22 to the microphone 24, and some equalization (tone control) and noise reduction. Advanced noise reduction algorithms may use more than one microphone.

Receiving-channel processing is applied to the speech or other audio that the headset wearer hears via speaker 22. Receiving-channel processing typically includes equalization (tone control), noise reduction and some combination of automatic and manual volume controls. A proportion of the sending-channel audio is mixed into the receiving-channel as sidetone using a sidetone mixer.

Headset 2 may include more than one speaker (e.g. for stereo music playback). In one example, the sound exposure dosimeter 26 monitors the receiving-channel speech level at the output of sidetone mixer, after all audio signal processing and gain control has been applied. TWA limiter 28 applies gain attenuation to the audio signal when a threshold intervention level is exceeded, as described in further detail below.

In one example embodiment operation, TWA limiter 28 utilizing sound dosimeter 26 determines an accumulated sound dose exposure from the audio signal output at the speaker 22, and determines whether a predicted sound dose exposure for a total session time (e.g., an 8 hour workday) exceeds or falls below a permitted sound dose exposure limit, where the predicted sound dose exposure is determined from the accumulated sound dose exposure. TWA limiter 28 adjusts a threshold intervention level at which the time-weighted-average limiter 28 applies attenuation to the audio signal output at the headset speaker 22, where the threshold intervention level is adjusted responsive to whether the predicted sound dose exposure for the total session time exceeds or falls below the permitted sound dose exposure limit.

In one example embodiment operation, TWA limiter 28 utilizing sound dosimeter 26 determines a current sound subdose for a current pre-determined time interval a headset user is exposed to resulting from an audio signal output at the headset speaker 22. In one example, the current pre-determined time interval is between 1 and 10 minutes.

TWA limiter 28 determines a predicted sound dose exposure for a total time period (e.g., an 8 hour workday) from the current sound subdose. In one example, to determine the predicted sound dose exposure for a total time period, the current sound subdose is stored in a sequential subdose array, wherein the sequential subdose array has a total number of array elements corresponding to the total time period. A mean subdose of all previously stored subdoses in the sequential subdose array is determined, and future remaining open subdose array elements are populated with the mean subdose. In one example, the current sound subdose and all prior determined sound subdoses from prior pre-determined time intervals are stored in a non-volatile memory 20.

TWA limiter 28 determines whether the predicted sound dose exposure for the total time period exceeds a permitted total time period sound dose limit or falls below the permitted total time period sound dose limit. TWA limiter 28 determines an accumulated sound dose exposure, where the accumulated sound dose exposure is the sum of the current sound subdose with all prior determined sound subdoses from prior pre-determined time intervals. TWA limiter 28 adjusts an intervention threshold responsive to the accumulated sound dose exposure and the predicted sound dose exposure for the total time period. TWA limiter 28 attenuates an output level of the audio signal from the headset speaker 22 responsive to determining the intervention threshold is exceeded by the audio signal.

In one example embodiment operation, TWA limiter 28 utilizing sound dosimeter 26 determines an accumulated sound dose exposure from a headset speaker 22 for a plurality of sequentially monitored time intervals during a current listening session, where the current listening session is a total session time (e.g., an 8 hour workday). In one example, determining the accumulated sound dose exposure further includes receiving at the headset 2 from a remote device a prior accumulated sound dose exposure.

TWA limiter 28 determines whether a predicted sound dose exposure for the total session time exceeds or falls below a permitted sound dose exposure limit, where the predicted sound dose exposure is determined from the accumulated sound dose exposure. In one example, the accumulated sound dose exposure is stored in a non-volatile memory 20.

TWA limiter 28 adjusts a threshold intervention level at which a time-weighted-average limiter 28 applies attenuation to an audio signal output at the speaker 22. The threshold intervention level is adjusted responsive to whether the predicted sound dose exposure for the total session time exceeds or falls below the permitted sound dose exposure limit. In one example, the threshold intervention level is further adjusted responsive to the accumulated sound dose exposure. In one example, the threshold intervention level is adjusted so that the accumulated sound dose exposure is equal to the permitted sound dose exposure limit at the end of the total session time.

In one example, TWA limiter 28 identifies a no-activity time period greater than the activity time period during which there is no audio signal which indicates the start of a new shift period, and resets the accumulated sound dose exposure to zero responsive to the no-activity time period. In one example, headset 2 transmits the accumulated noise dose exposure to a cloud-based device, wherein the accumulated noise dose exposure is associated with a specific headset user.

In one example, sound dosimeter 26 performs true RMS dosimetry using the following method: (1) process receive audio signal through calibrated headset modeling filter (HMF), (2) acquire 125 ms of signal (2000 samples at 16 kS/s), (3) square all samples, (4) compute the mean of all samples, (5) convert to dB, (6) compute the subdose of the 125 ms window, and (7) accumulate subdoses for evaluation period (e.g. 1-10 mins). The evaluation period is chosen such that if the data for one period is lost, the resulting error is not great (<1% for instance) while the burden on storage and messaging infrastructure is not excessive. The evaluation period data could be stored in NVS or alternatively, it could be transmitted to a cloud based storage service. The requirement for the improved TWA limiter 28 is that the history of the exposure for the shift is available to enable the limiting strategy.

The objective of the limiting strategy is to allow the user to use the full dynamic range of the headset 2 as they see fit and only to intervene when there is sufficient cause to believe that the allowed shift exposure will be exceeded. For instance, during a rest period, the agent may wish to listen to music which has a much higher energy density than speech and would trigger an exponential average based limiter, detracting from their listening pleasure. As previously described, brief temporary conditions may occur throughout the day where the agent needs extra loudness to be able to hear clearly; while there is room for the extra accumulated exposure, the agent should be allowed this loudness to efficiently do their job.

Figure 10:
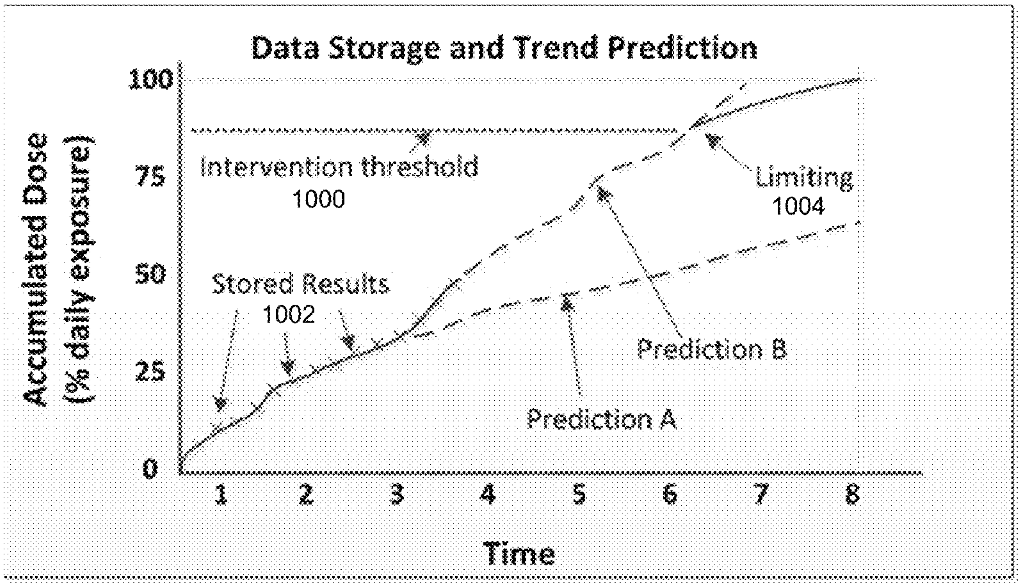
FIG. 10 illustrates an adjustable intervention threshold based on accumulated sound subdoses and predicted total sound dose.

Various limiting strategies may be used in various examples of the invention, and one example is presented here and illustrated in FIG. 10. At the start of the shift, an array of subdoses is initialized and as the shift proceeds, the computed subdoses are sequentially stored in the array. Each time a new subdose is stored, the algorithm computes the mean of the past subdoses and populates the future subdoses with this value. It can then compute a predicted exposure for the complete shift (shown as Prediction A and Prediction B in FIG. 10) and use this to determine the potential risk that the daily exposure may be exceeded and send this as a warning message to the agent or their supervisor.

As each subdose is stored to the array, the algorithm also computes the total accumulated exposure for the shift so far (shown as stored results 1002). This is compared to the intervention threshold (shown as adjustable intervention threshold 1000) to determine is action is required. Simulations show that an intervention threshold of 90% produces good results, allowing full use of the dynamic range while still providing sufficient time to react and limit exposure gradually. In one example, limiting intervention threshold 1000 is dependently adjusted on the prediction slope of the accumulated subdoses (e.g., of Prediction A or Prediction B) and the time remaining in the shift period (e.g., total session time). In the example shown in FIG. 10, Prediction B indicates that the permitted sound dose limit will be exceeded within the shift period whereas it will not in Prediction A. For example, the limiting intervention threshold 1000 is adjusted downward for Prediction B and adjusted upward for Prediction A.

When the intervention threshold 1000 is crossed (indicated by limiting point 1004), the limiter 28 starts to apply attenuation and also starts to linearly ramp the intervention threshold 1000 up such that 100% exposure is achieved at the end of the shift. After each subsequent evaluation period, if the exposure is still above the current intervention threshold 1000 then more attenuation is applied, if the exposure has dropped below the new intervention threshold 1000 then attenuation is released. The amount of attenuation added or removed at each evaluation period needs is tuned such that level changes are gradual and do not oscillate needlessly but as long as the evaluation period is reasonably short (<10 mins) this is not difficult. Sample simulations were performed using an evaluation period of 125 ms which is excessively fast and required attenuation adjustments of 0.0004 dB to produce smooth stable limiting. With a 1 minute evaluation period, attenuation adjustments of 0.2 dB are more reasonable.

Figure 4:
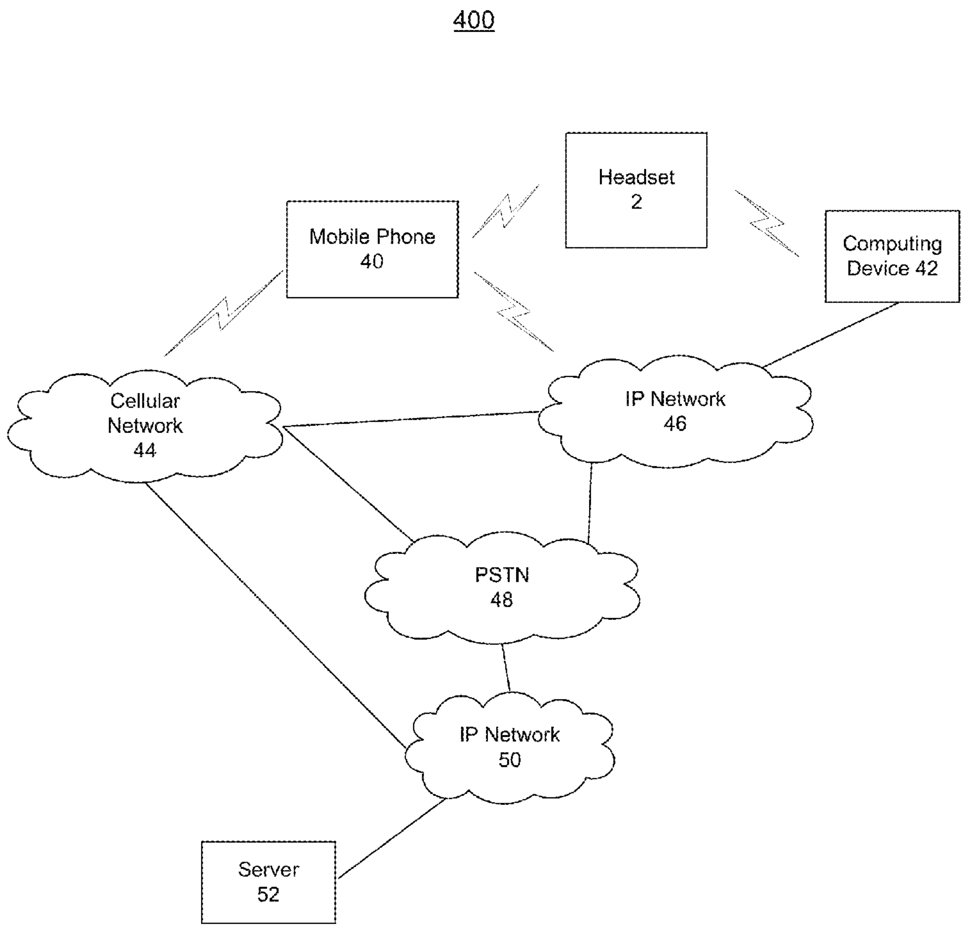
FIG. 4 illustrates use of the headset shown in FIG. 3 in a communication system.

FIG. 4 illustrates use of the headset shown in FIG. 3 in a communication system 400 according to one embodiment. Referring to FIG. 4, the communication system 100 includes a headset 2, a mobile phone 40 (e.g., a smartphone), a computing device 42, a cellular network 44, an IP network 46, an IP network 50, a public switched telephone network (PSTN) 48, and a server 52. In the example of FIG. 1, the headset 2 is a wireless headset, and so may have a wireless connection to the mobile phone 40 or computing device 42. However, in other embodiments, the headset 2 may be a wired headset, and so may have a wired connection (e.g. micro-USB or USB) to the computing device 42 or mobile phone 40. Headset 2 may receive an input audio signal from any audio signal source which can be connected to a headset. The input audio signal may, for example, be speech corresponding to a far end telephone call participant or music output from a music player at computing device 42 or mobile phone 40.

The wireless connection between the headset 2 and the mobile phone 40 or computing device 42 may be of any type. For example, the wireless connection may be a Bluetooth link, a DECT link, or the like. The headset 2 may have a Wi-Fi connection to the IP Network 46. The mobile phone 40 or computing device 42 may have a Wi-Fi connection to the IP Network 46, such as via an Access Point. The mobile phone 40 or computing device 42 may have a mobile connection to the cellular network 44. The cellular network 44 may be connected to the IP Network 50 (e.g., the Internet) and to the PSTN 48. The IP network 50 may be connected to the PSTN 48. The server 52 may be connected to the IP Network 50.

In one example, headset 2 may couple to computing device 42 using a headset adapter. In one example, methods and processes for TWA limiting and sound dosimetry described herein are implemented at the headset adapter. In further examples, methods and processes for TWA limiting and sound dosimetry described herein are implemented at computing device 42 or mobile phone 40.

In one example, headset 2 reports all sound dose data (e.g., accumulated sound dose exposure determinations) to server 52 for storage and analysis by individual user. Applications at server 52 may perform a variety of data analysis on the received sound dose data, allowing for more accurate and intelligent limiting strategies that take better account of varying listening patterns to be applied. Listening patterns over multiple days may be analyzed and a unique limiting profile designed to address the specific needs of a user.

Figure 5:
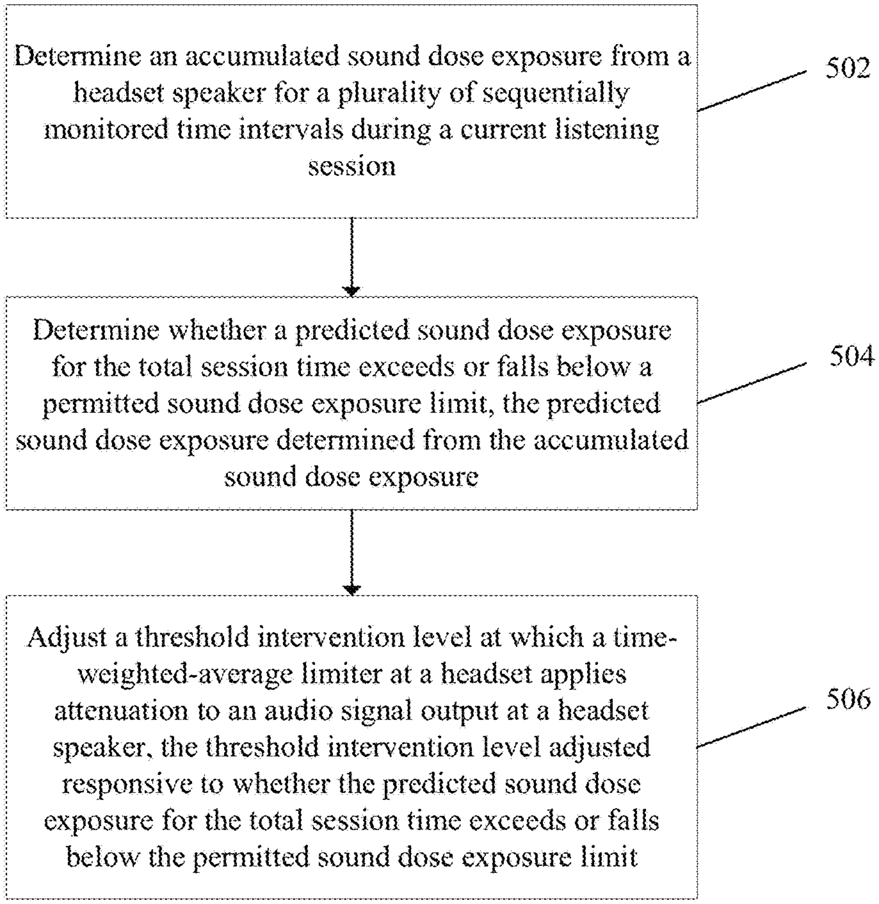
FIG. 5 is a flow diagram illustrating a method for limiting a headset user sound exposure in one example.

FIG. 5 is a flow diagram illustrating a method for limiting a headset user sound exposure in one example. At block 502, an accumulated sound dose exposure from a headset speaker is determined for a plurality of sequentially monitored time intervals during a current listening session, where the current listening session has a total session time. In one example, the total session time is 8 hours.

In one example, the accumulated sound dose exposure is stored in a non-volatile memory. In one example, the accumulated sound dose exposure is further determined by receiving at the headset from a remote device a prior accumulated sound dose exposure. In one example, the accumulated sound dose exposure is transmitted to a cloud-based device, wherein the accumulated sound dose exposure is associated with a specific headset user. In one example, the process further includes identifying a no-activity time period during which there is no audio signal, and resetting the accumulated noise dose exposure to zero responsive to the no-activity time period.

At block 504, it is determined whether a predicted sound dose exposure for the total session time exceeds or falls below a permitted sound dose exposure limit. The predicted sound dose exposure is determined from the accumulated sound dose exposure.

At block 506, a threshold intervention level at which a time-weighted-average limiter at a headset applies attenuation to an audio signal output at a headset speaker is adjusted, the threshold intervention level adjusted responsive to whether the predicted sound dose exposure for the total session time exceeds or falls below the permitted sound dose exposure limit. In one example, the threshold intervention level is further adjusted responsive to the accumulated sound dose exposure. In one example, the threshold intervention level is adjusted so that the accumulated sound dose exposure is equal to the permitted sound dose exposure limit at the end of the total session time.

Figure 6:
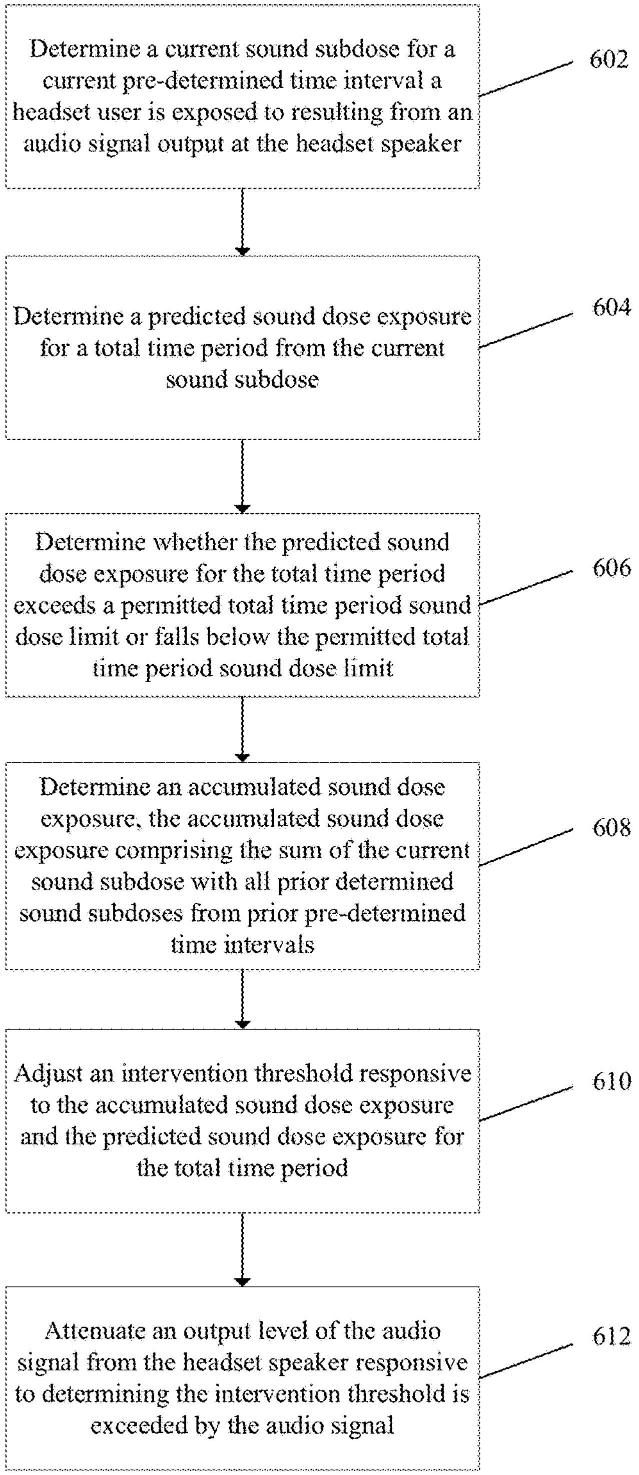
FIG. 6 is a flow diagram illustrating a method for limiting a headset user sound exposure in a further example.

FIG. 6 is a flow diagram illustrating a method for limiting a headset user sound exposure in a further example. At block 602, a current sound subdose for a current pre-determined time interval a headset user is exposed to resulting from an audio signal output at the headset speaker is determined. In one example, the current pre-determined time interval is between 1 and 10 minutes.

At block 604, a predicted sound dose exposure for a total time period from the current sound subdose is determined. In one example, the total time period is 8 hours. In one example, determining the predicted sound dose exposure for a total time period includes (a) storing the current sound subdose in a sequential subdose array, wherein the sequential subdose array comprises a total number of array elements corresponding to the total time period, (b) determining a mean subdose of all previously stored subdoses in the sequential subdose array, and (c) populating future remaining open subdose array elements with the mean subdose.

At block 606, it is determined whether the predicted sound dose exposure for the total time period exceeds a permitted total time period sound dose limit or falls below the permitted total time period sound dose limit. At block 608, an accumulated sound dose exposure is determined, the accumulated sound dose exposure comprising the sum of the current sound subdose with all prior determined sound subdoses from prior pre-determined time intervals. In one example, the current sound subdose and all prior determined sound subdoses from prior pre-determined time intervals are stored in a non-volatile memory. In one example, determining the accumulated sound dose exposure further comprises receiving at the headset from a remote device a prior accumulated sound dose exposure.

In one example, the accumulated sound dose exposure is transmitted to a cloud-based device, wherein the accumulated sound dose exposure is associated with a specific headset user. In one example, the process further includes identifying a no-activity time period during which there is no audio signal, and resetting the accumulated noise dose exposure to zero responsive to the no-activity time period.

At block 610, an intervention threshold is adjusted responsive to the accumulated sound dose exposure and the predicted sound dose exposure for the total time period. In one example, the intervention threshold is adjusted so that the accumulated sound dose exposure is equal to the permitted total time period sound dose limit at the end of the total time period. At block 612, an output level of the audio signal from the headset speaker is attenuated responsive to determining the intervention threshold is exceeded by the audio signal.

In one example, determining an accumulated sound exposure from the headset speaker is performed as follows. The process is generally divided into two parts: initial calibration of the wireless headset to make sound dose measurements and actual sound dose measurements.

Figure 7:
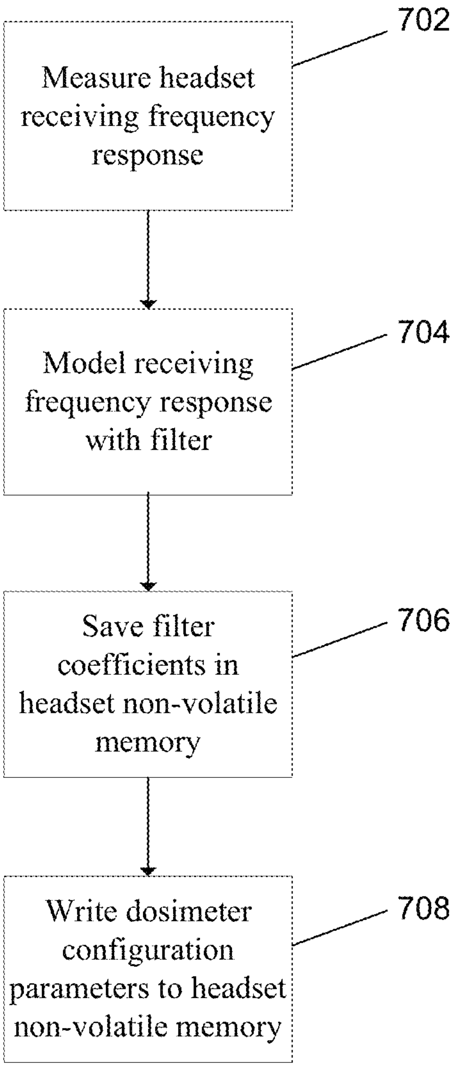
FIG. 7 is a flow diagram illustrating initial calibration of a headset for measuring sound dose in one example.

First, a headset modeling filter is generated. FIG. 7 is a flow diagram illustrating initial calibration of a wireless headset for measuring sound dose in one example. At block 702, the headset's receiving frequency response is measured. At block 704, the receiving frequency response is modeled with a digital filter. In one example, a 32-tap FIR filter is used. In a further example, a longer 128-tap FIR filter is utilized. At block 706, the FIR filter coefficients are stored in non-volatile memory. At block 708, the required dosimeter configuration parameters are saved in the non-volatile memory. The dosimeter configuration parameters may include a criterion sound level, an exchange rate, and a threshold sound level.

The headset's receiving frequency response is measured as follows. For the highest measurement accuracy each headset is individually calibrated by measuring and modeling each individual headset receiving frequency response. For mass production the cost of calibration is avoided, with a slight reduction in measurement accuracy, by programming all headsets of a particular type with the same "generic" FIR filter coefficients. The generic FIR filter coefficients would be derived from frequency response measurements for a statistically significant sample of the headsets.

The process at block 704 whereby the receiving frequency response is modeled with an FIR filter will now be described in further detail. Sound dose exposure calculations are based on A-weighted diffuse-field sound pressure level (SPL) measurements. In non-headset cases, SPL is measured directly using a sound level meter located in the same room as the employees whose daily personal sound exposure is to be measured. However headsets are a special case, because the sound from one user's headset is not heard at the same volume by other people nearby, and cannot be measured by a sound level meter located in the room. Headset sound level measurements rely on measuring SPL at the headset-user's eardrum, using a head and torso simulator (HATS), and then calculating an equivalent diffuse-field SPL. The equivalent diffuse-field SPL is the SPL that a sound level meter would measure if the sound at the headset user's eardrum were produced by an open-field sound instead of by the headset.

Figure 8:
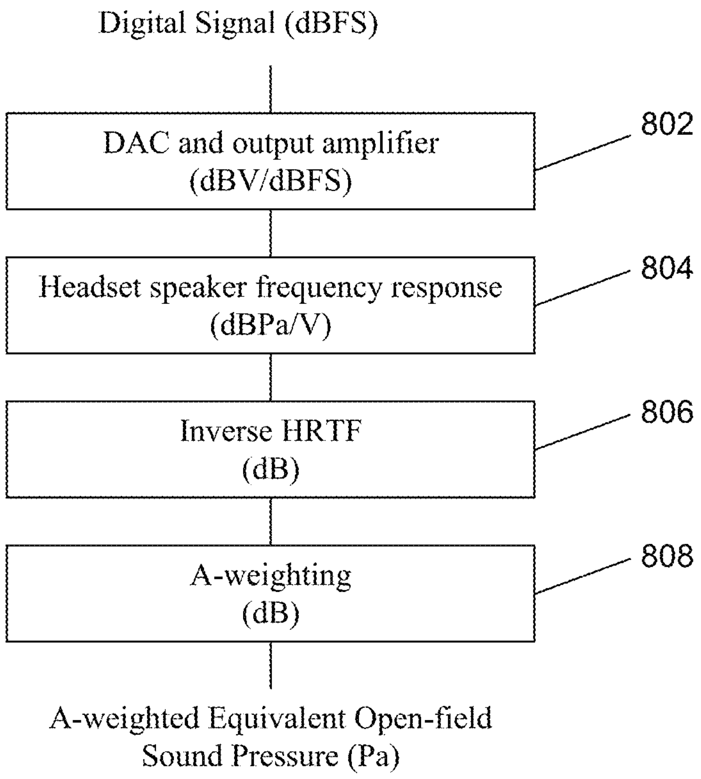
FIG. 8 illustrates a block diagram of a headset's notional receiving-channel electroacoustic signal path that is used to calculate equivalent open-field SPL.

A headset's equivalent diffuse-field SPL depends on the digital signal level driving the headset's speaker (i.e. after all volume controls), and the transfer functions of all the blocks in the electroacoustic signal path between the point at which the digital signal is observed and the notional diffuse-field measurement point. FIG. 8 illustrates a block diagram of a headset's notional receiving-channel electroacoustic signal path that is used to calculate equivalent open-field SPL. Each block is a frequency dependent transfer function. The combined DAC and amplifier transfer function 802 and the headset speaker's frequency response 804 are measured directly. Typically the combined DAC and output amplifier transfer function 802 varies very little from one headset to the next, so can be considered invariant. The headset speaker's frequency response 804 varies significantly from one headset model to another, and to a lesser degree between different headsets of the same model. The inverse head-related transfer function (HRTF) 806, which transforms sound measurements at the eardrum reference point (DRP) of a head and torso simulator (HATS) into equivalent diffuse-field SPL, and the A-weighting function 808 are standard published data.

The frequency responses of all four blocks are combined into a single composite transfer function. Real-time equivalent diffuse-field SPL measurements are made using a digital system modeling filter that is designed to have a frequency response that exactly matches the physical system's composite transfer function. The digital data from the headset's output buffer are processed by the system modeling filter, which calculates the acoustic pressure waveform at the notional diffuse-field measurement point.

Many different digital filter topologies can be used to implement the system modeling filter, each with particular advantages and disadvantages. In one example, a finite impulse response (FIR) filter is used. Advantages of an FIR filter include being relatively easy to design a filter to match any desired magnitude frequency response, the resulting filter is unconditionally stable, regardless of the transfer function being modeled, and the filtering process does not generate significant noise. In a further example, an infinite impulse response (IIR) filter is used, in which each output sample is a weighted sum of previous input and output samples. An IIR filter can often implement the desired magnitude frequency response with less arithmetic operations than an equivalent FIR filter, but can become unstable because of the feedback of output to input. Designing an IIR filter to meet a target frequency response is generally more demanding than designing an FIR filter, and less amenable to automation. Within the two main classes of digital filter, FIR and IIR, there are many different filter topologies, each with particular properties that may make them more or less suitable for specific applications. The sound pressure waveform at the system modeling filter's output is processed by an rms (root mean-square) level detector to determine the equivalent diffuse-field SPL.

Determining the accumulated (i.e., cumulative) sound dose exposure is as follows:

RMS Level in dBA $$L = 10 * \log_{10}\left(\frac{1}{n}\sum_{1}^{n} x_n^2\right)$$

Where:

n=τ*F

τ=time constant in seconds

F=sample rate in samples per second

Subdose in % of Daily Dose $$d = \tau * \left( \frac{2^{\frac{(L-D)}{E}}}{3600 * P} \right) * 100$$

Where:

τ=time constant in seconds

L=RMS Level in dBA

D=Daily Dose (TWA Limit) in dBA

E=Exchange Rate in dB

P=Total Shift Period in hours

The subdose is a percentage value, where 100% corresponds to a daily personal sound exposure equal to the criterion sound level that was set when configuring the dosimeter.

Figure 9:
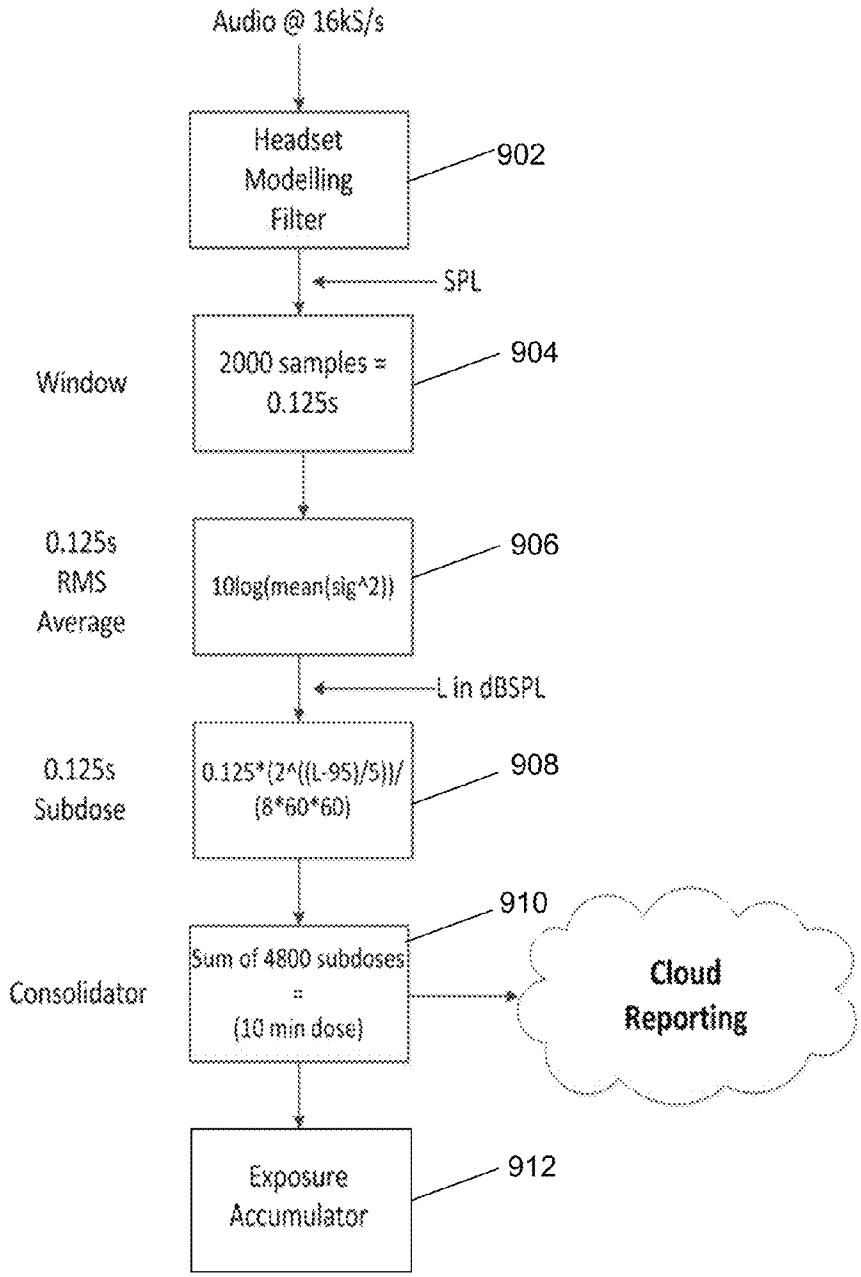
FIG. 9 illustrates measuring subdoses and determining accumulated sound dose using true RMS dosimetry in one example.

FIG. 9 illustrates measuring subdoses and determining accumulated noise dose in one example using true RMS dosimetry. At block 902, the receive audio signal is processed through the calibrated headset modeling filter (HMF). At block 904, 125 ms of signal is acquired (2000 samples at 16 kS/s). At block 906 all samples are squared and the mean of all samples is calculated and converted to dB. At block 908, the subdose of the 125 ms window is calculated. At block 910, the subdoses for evaluation period (e.g. 10 mins) are accumulated. In a further example, the evaluation period is between 1 and 10 minutes. At block 912, the subdoses for each prior evaluation period are accumulated to determine the cumulative exposure during the current session. In one example, results of the process illustrated in FIG. 9 are used in the process described in reference to FIG. 10.

Figure 11:
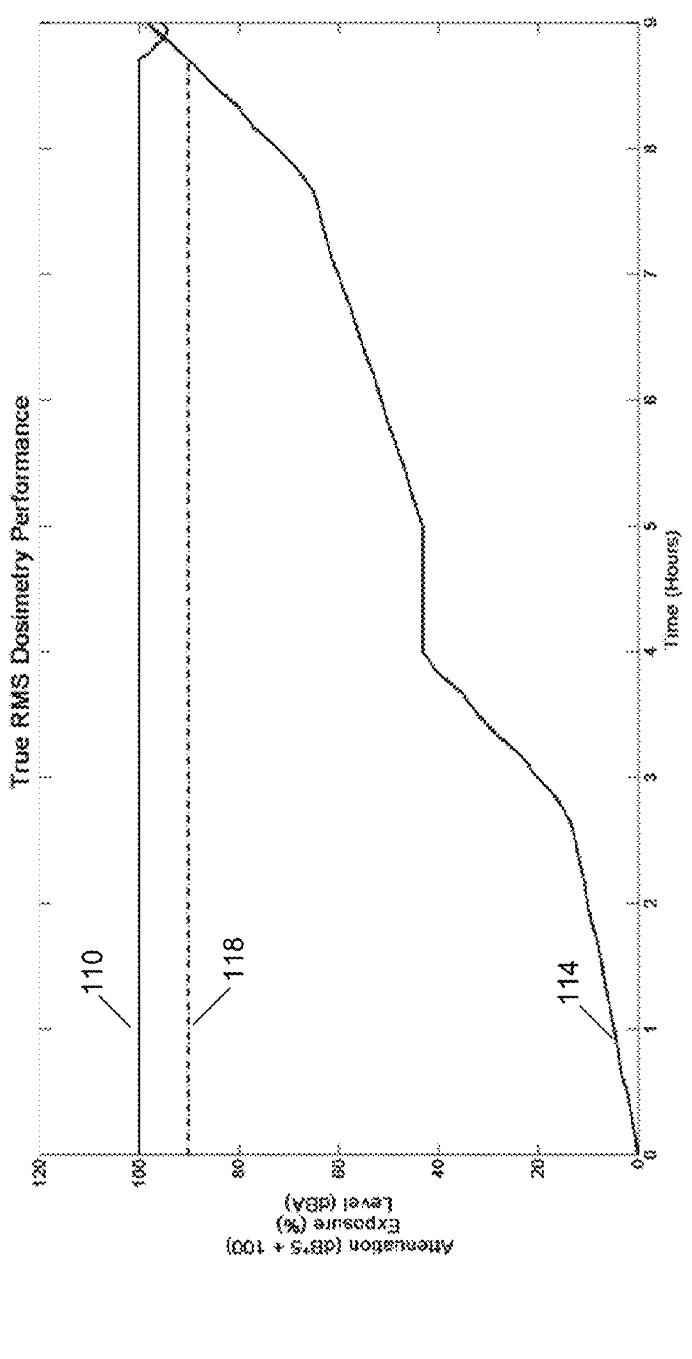
FIG. 11 illustrates operation of a time-weighted-average limiter on the signal shown in FIG. 1 in one example of the invention.

FIG. 11 illustrates operation of a time-weighted-average limiter on the signal shown in FIG. 1 in one example of the invention. Comparing the performance of this limiting strategy to the prior 10 minute exponential average limiter shown in FIG. 2, the benefits of true RMS dosimetry are seen.

The limiting (line 110) occurring in the fourth hour in FIG. 2 does not occur and not until the last 20 minutes of the shift, when the accumulated exposure reaches 90% (indicated by dashed line 118) does the limiter activate, applying less than 2 dB of attenuation to prevent the exposure from just crossing the 100% level. Note that the 10 minute exponential average would have failed to activate in this particular scenario when in fact the true RMS exposure for the unlimited case would have exceeded the limit. This is due to the fact that an exponential average can only be calibrated to agree with a true RMS for a sine wave. Any other signal such as speech will have a variable error as seen in the difference between the line 114 in FIG. 11 and dashed line 116 shown in FIG. 2.

When used for other applications, such as a Personal Music Player (PMP) device, the true RMS dosimetry limiter also provides benefits. In one example simulation, the headset user listens to music at high volume for an hour at a level of 90 dBA and within 10 minutes, the exponential average limiter is applying attenuation and while the 90 dBA for 1 hour slightly exceeds the TWA exposure limit, the limiter only allows 30% exposure. The true RMS dosimetry limiter allows the full hour at the elevated error and then quickly ramps to a quiet state.

Soft Clipping

In addition to attenuation of the output audio signal using direct attenuation and compression techniques, psycho-acoustic techniques including soft clipping and multiband companding may be used. The psycho-acoustic techniques may be used individually or in combination for a given system. The psycho-acoustic techniques advantageously reduce the RMS energy in the sound while leaving perceived loudness and intelligibility unchanged. As such, the limiting strategy employed when the intervention threshold is crossed is much improved.

In one example, the output level of the audio signal output at the headset speaker is attenuated using signal clipping if the intervention threshold is exceeded by the audio signal. A soft clipping is utilized, which removes only the high energy peaks in the speech that contribute most to the exposure whilst leaving all the low level detail that provides intelligibility untouched. The soft clipping minimizes distortion and the accompanying loss of intelligibility but beneficially provides an audible feedback to the user that limiting is active as distortion is intuitively associated with excessive loudness.

In one example implementation, the clip level is initially set to a high value, e.g. 117 dBSPL, so that there is no clipping performed on the audio signal. When the accumulated dose exceeds the intervention threshold, the clip level is slowly reduced to start clipping action on the current signal and the intervention threshold is ramped upward such that it hits 100% at the end of the shift. As the exposure accumulation rate is slowed and the intervention threshold slowly rises, the system comes into equilibrium whereby the clip level is held at its least invasive point.

In one example, clip gain is calculated on a per-sample basis according to:

$$\text{gain}_n = \left( \frac{l}{|\text{sample}_n|} \right)^c$$

Where l=amplitude of desired clip level c=clip factor (1=hard clip, <1 soft clip, 0.5 is proposed)

FIG. 12 illustrates adjustment of a soft clip level when an accumulated dose passes an intervention threshold level in one example. The use of soft clipping offers several advantages. First, soft clipping addresses the speech peaks only which are a large contributor to the overall exposure whilst leaving low level detail and subtle intonation in speech untouched. Second, soft clipping provides audible feedback to the user that something is wrong, as distortion is intuitively associated with excessive levels. Third, soft clipping provides good reduction in sound exposure for the loss of loudness. Once limiting is active (i.e., above the intervention threshold level), any increase of the volume setting by the user will immediately result in increased distortion, thereby breaking the volume increase—limiting increase cycle.

Multi-Band Companding

In one example, multiband companding is performed on the audio signal output at the headset speaker if the intervention threshold is exceeded by the audio signal. The multiband companding splits the audio signal into numerous bands and performs simultaneous compression and expanding on each band independently. This allows all the sound elements comprising speech to be controlled individually and provides great flexibility to control RMS energy, perceived loudness and intelligibility at the same time.

Due to the nature of exposure dosimetry, a small dB decrease in loudness enables twice as much time listening as the same small dB increase in loudness takes away. There are two ways to exploit this observation; firstly, the use of a compression algorithm working on the speech peaks to bring signal periods above the TWA limit below the TWA limit will extend the amount of time the user can listen at that level significantly. Such compression algorithms have very little effect on the perceived loudness of the signal and are of little consequence for speech but the music purist may frown on such manipulation. Secondly, if a small reduction in signal level can be made before the daily dose has been reached, additional time beyond the expected shift period can be allowed. This would provide a solution to the headset effectively going dead when 100% dose is reached.

In one example implementation, the process is as follows. Initially, the multiband compandor functions only as a dynamic level adjust (DLA), serving to maintain a constant loudness within speech and call-to-call. This is achieved by means of fast attack time constant (1-5 ms) relative to the duration of utterances and a medium release time constant (100-300 ms). The gain ratio is set for aggressive compression (>3:1) for all signals above minimum signal level (approx. −50 dBFS). This allows for natural speech dynamics.

When the accumulated dose passes the intervention threshold, the multiband compandor is slowly adjusted to start emphasizing low level speech detail while attenuating high energy speech components and the intervention threshold is ramped upward such that it hits 100% at the end of the shift. While sound exposure management in active (i.e., accumulated dose is above intervention threshold) any adjustment of the volume control by the user would instead adjust the multiband compandor parameters to increase the perceived loudness while leaving the total RMS energy unchanged.

Multiband Compandor Parameter Settings

In one example, the filter bands used are as described in "Auditory Patterns," Harvey Fletcher, Rev. Mod. Phys. 12, 47-65 (1940) invoking the correct psychoacoustic masking effects. Within each band, three regions are defined: at the low level from the noise floor to the minimum speech level is the expansion region, from the minimum to the nominal speech level is the linear region, and above the nominal level is the compression region. For each band, the two thresholds marking the transition between regions are adjustable. For each region, the expansion/compression ratio and the attack and release time constants are adjustable.

The sound exposure management configuration of the multiband expander is a continuum of settings becoming more aggressive as more RMS energy is removed from the high energy components of the speech and more emphasis is placed on lower energy speech components to maintain loudness and intelligibility. This continuum is illustrated in the table shown in FIG. 13. The parameters can take any value in the described range and the value within the range is computed by the degree to which the accumulated dose exceeds the intervention threshold and by the requested volume increase steps since intervention was activated.

Due to the exposure management afforded by the DLA function and the fact that the intervention threshold allows small corrections to RMS energy to be made early on, any changes needed to achieve a final exposure at the end of the shift would be small. Consequently, the entire exposure management range of parameters are delivered as a linear function computed as:

$$\text{factor} = \frac{((\text{accumulated dose} - \text{intervention threshold}) + \text{requested volume increase})}{10}$$

The factor is limited to a range of 0 to 1, where 0 corresponds to the mild parameter settings and 1 corresponds to the aggressive settings. As can be seen, the multiband compander settings chosen based on this factor are based on the degree to which the accumulated dose exposure is above the intervention threshold. The factor provides a mechanism for mapping the adjustment range due to demand for adjustment by the system. In one example, where the user has not changed the volume setting, if the accumulated dose exposure is above the intervention threshold, the factor changes slowly so as to be nearly imperceptible to the user. In contrast, where the user changes the volume setting, the factor changes quickly to give the user immediate gratification/perception of change.

To illustrate, in an example scenario where the accumulated dose is at the intervention threshold, e.g. accumulated dose−intervention threshold=0, if the user requests a 2 dB volume increase, the factor is 2/10 (i.e., 20%). Responsive to the user request, the multiband compandor settings are adjusted upward 20% within the continuum between mild and aggressive. Referring to FIG. 13 for example, in the expansion region, the attack time is adjusted 20% from the mild attack time setting (50 ms) in the direction of the aggressive attack time setting (30 ms). Thus, in this example scenario, the attack time is adjusted from 50 ms to 46 ms.

The use of multiband companding provides several advantages. Multiband companding offers the ability to increase perceived loudness and intelligibility while simultaneously reducing RMS level and exposure. A single algorithm can perform the Dynamic Level Adjust (DLA) functionality as well as sound exposure management. Furthermore, the user of multiband companding does not introduce any distracting artifacts in the audio signal.

The use of soft-clipping, compression and expansion (especially in multiband companding implementations) in conjunction with true RMS dosimetry limiting offers advantages over pure limiting (e.g., direct attenuation) for enhanced exposure management strategies. The use of the enhanced limiting strategies achieves the desired objective to reduce RMS energy in the signal while maintaining perceived loudness and intelligibility.

Embodiments of the present disclosure provide an improved TWA limiter in a wearable audio device. For convenience, the wearable audio device is described herein in terms of a headset having a microphone and loudspeaker. However, it will be understood that the wearable audio device may be implemented as any wearable device. For example, the wearable audio device may be implemented as a headset, bracelet, garment, or the like.

Various embodiments of the present disclosure are applicable to all current and future USB corded, Bluetooth and DECT wireless headsets. It applies to both communication and multimedia applications, including gaming headset products. Furthermore, the device may be any audio device that uses sound-sources placed close to the ear. Such devices include, for example, wireless headsets or telephones using other transmission protocols besides Bluetooth (DECT, GSM, IEEE 802.11, etc.), corded headsets and telephones, and media players.

While the exemplary embodiments of the present invention are described and illustrated herein, it will be appreciated that they are merely illustrative and that modifications can be made to these embodiments without departing from the spirit and scope of the invention. Certain examples described utilize headsets which are particularly advantageous for the reasons described herein. Acts described herein may be computer readable and executable instructions that can be implemented by one or more processors and stored on a computer readable memory or articles. The computer readable and executable instructions may include, for example, application programs, program modules, routines and subroutines, a thread of execution, and the like. In some instances, not all acts may be required to be implemented in a methodology described herein.

Terms such as “component”, “module”, “circuit”, and “system” are intended to encompass software, hardware, or a combination of software and hardware. For example, a system or component may be a process, a process executing on a processor, or a processor. Furthermore, a functionality, component or system may be localized on a single device or distributed across several devices. The described subject matter may be implemented as an apparatus, a method, or article of manufacture using standard programming or engineering techniques to produce software, firmware, hardware, or any combination thereof to control one or more computing devices.

Thus, the scope of the invention is intended to be defined only in terms of the following claims as may be amended, with each claim being expressly incorporated into this Description of Specific Embodiments as an embodiment of the invention.

What is claimed is:

1. A method for limiting a headset user noise exposure comprising:

determining by one or more processors a current sound subdose for a current pre-determined time interval a headset user is exposed to resulting from an audio signal output at a headset speaker;

determining by said one or more processors a predicted sound dose exposure for a total time period from the current sound subdose;

determining by said one or more processors whether the predicted sound dose exposure for the total time period exceeds a permitted total time period sound dose limit or fails below the permitted total time period sound dose limit;

determining by said one or more processors an accumulated sound dose exposure, the accumulated sound dose exposure comprising a sum of the current sound subdose with all prior determined sound subdoses from prior pre-determined time intervals;

adjusting by said one or more processors an intervention threshold responsive to the accumulated sound dose exposure and the predicted sound dose exposure for the total time period; and attenuating by said one or more processors an output level of the audio signal from the headset speaker responsive to determining the intervention threshold is exceeded by the audio signal.

2. The method of claim 1, wherein determining, by one or more processors, the predicted sound dose exposure for the total time period comprises:

storing the current sound subdose in a sequential subdose array, wherein the sequential subdose array comprises a total number of array elements corresponding to the total time period;

determining a mean subdose of all previously stored subdoses in the sequential subdose array; and populating future remaining open subdose array elements with the mean subdose.

3. The method of claim 1, wherein the current pre-determined time interval is between 1 and 10 minutes.

4. The method of claim 1, wherein the current sound subdose and all prior determined sound subdoses from prior pre-determined time intervals are stored in a non-volatile memory.

5. The method of claim 1, further comprising:

identifying a no-activity time period during which there is no audio signal; and resetting the accumulated sound dose exposure to zero responsive to the no-activity time period.

6. The method of claim 1, wherein the intervention threshold is adjusted so that the accumulated sound dose exposure is equal to the permitted total time period sound dose limit at an end of the total time period.

7. The method of claim 1, wherein attenuating, by said one or more processors, the output level of the audio signal from the headset speaker responsive to determining the intervention threshold level is exceeded by the audio signal comprises soft clipping the audio signal.

8. The method of claim 1, further comprising reducing a signal clip level above an audio signal RMS level at which the audio signal is clipped responsive to determining the intervention threshold is exceeded by the audio signal.

9. The method of claim 1, further comprising reducing a signal clip level above an audio signal RMS level at which the audio signal is clipped, clipping the audio signal, and increasing the intervention threshold responsive to determining the intervention threshold is exceeded by the audio signal.

10. A method for limiting a headset user sound exposure comprising:

determining by one or more processors an accumulated sound dose exposure from a headset speaker for a plurality of sequentially monitored time intervals during a current listening session, wherein the current listening session comprises a total session time;

determining by said one or more processors whether a predicted sound dose exposure for the total session time exceeds or falls below a permitted sound dose exposure limit, the predicted sound dose exposure determined from the accumulated sound dose exposure; and adjusting by said one or more processors a threshold intervention level at which a time-weighted-average limiter at a headset applies attenuation to an audio signal output at the headset speaker, the threshold intervention level adjusted responsive to whether the predicted sound dose exposure for the total session time exceeds or falls below the permitted sound dose exposure limit.

11. The method of claim 10, wherein the threshold intervention level is further adjusted responsive to the accumulated sound dose exposure.

12. The method of claim 10, wherein the total session time is 8 hours.

13. The method of claim 10, wherein the accumulated sound dose exposure is stored in a non-volatile memory.

14. The method of claim 10, further comprising transmitting the accumulated sound dose exposure to a cloud-based device, wherein the accumulated sound dose exposure is associated with a specific headset user.

15. The method of claim 10, wherein the threshold intervention level is adjusted so that the accumulated sound dose exposure is equal to the permitted sound dose exposure limit at an end of the total session time.

16. The method of claim 10, further comprising: determining the threshold intervention level has been exceeded by the audio signal, and adjusting one or more multiband compandor settings.

17. The method of claim 10, further comprising: determining the threshold intervention level has been exceeded by the audio signal, receiving a user adjustment of a volume setting by a volume adjustment amount, and adjusting one or more multiband compandor settings responsive to the volume adjustment amount.

18. A head-worn device comprising:

a communications interface;

a speaker for outputting an audio signal into a user ear;

an amplifier;

a time-weighted-average limiter;

a processor; and one or more memories storing one or more application programs comprising instructions executable by the processor to cause the head-worn device to perform operations comprising determining an accumulated sound dose exposure from the audio signal output at the speaker, determining whether a predicted sound dose exposure for a total session time exceeds or falls below a permitted sound dose exposure limit, the predicted sound dose exposure determined from the accumulated sound dose exposure, and adjusting a threshold intervention level at which the time-weighted-average limiter applies attenuation to the audio signal output at the speaker, the threshold intervention level adjusted responsive to whether the predicted sound dose exposure for the total session time exceeds or falls below the permitted sound dose exposure limit.

19. The head-worn device of claim 18, wherein the communications interface comprises a wireless communications transceiver.

20. The head-worn device of claim 18, wherein the communications interface comprises a Universal Serial Bus interface.

21. The head-worn device of claim 18, wherein the threshold intervention level is further adjusted responsive to the accumulated sound dose exposure.

22. The head-worn device of claim 18, wherein the total session time is 8 hours.

23. The head-worn device of claim 18, wherein the accumulated sound dose exposure is stored in a non-volatile memory.

24. The head-worn device of claim 18, wherein determining the accumulated sound dose exposure further comprises receiving over the communications interface from a remote device a prior accumulated sound dose exposure.

25. The head-worn device of claim 18, wherein the threshold intervention level is adjusted so that the accumulated sound dose exposure is equal to the permitted sound dose exposure limit at an end of the total session time.

* * * * *